US010279610B2

(12) United States Patent
McConville et al.

(10) Patent No.: US 10,279,610 B2
(45) Date of Patent: May 7, 2019

(54) COOLING INSERT

(71) Applicant: Xerox Corporation, Norwalk, CT (US)

(72) Inventors: Paul J. McConville, Webster, NY (US);
Jason M. Lefevre, Penfield, NY (US);
Steven R. Moore, Pittsford, NY (US);
Douglas K. Herrmann, Webster, NY (US)

(73) Assignee: Xerox Corporation, Norwalk, CT (US)

( * ) Notice: Subject to any disclaimer, the term of this patent is extended or adjusted under 35 U.S.C. 154(b) by 203 days.

(21) Appl. No.: 15/384,425

(22) Filed: Dec. 20, 2016

(65) Prior Publication Data

US 2018/0170081 A1    Jun. 21, 2018

(51) Int. Cl.
| | | |
|---|---|---|
| *H01L 23/34* | (2006.01) | |
| *B41J 29/377* | (2006.01) | |
| *F28F 7/02* | (2006.01) | |
| *F28F 3/12* | (2006.01) | |
| *H01L 23/40* | (2006.01) | |
| *H01L 23/473* | (2006.01) | |
| *F28D 21/00* | (2006.01) | |
| *F28F 13/00* | (2006.01) | |
| *H01L 23/367* | (2006.01) | |

(52) U.S. Cl.
CPC ............ *B41J 29/377* (2013.01); *F28F 3/12* (2013.01); *F28F 7/02* (2013.01); *H01L 23/40* (2013.01); *H01L 23/473* (2013.01); *F28D 2021/0029* (2013.01); *F28F 2013/006* (2013.01); *F28F 2265/24* (2013.01); *H01L 23/3677* (2013.01)

(58) Field of Classification Search
CPC .... B41J 29/377; F28F 3/12; F28F 7/02; F28F 2013/006; F28F 2265/24; H01L 23/473; H01L 23/40; H01L 23/3677; F28D 2021/0029
See application file for complete search history.

(56) References Cited

U.S. PATENT DOCUMENTS

| | | | |
|---|---|---|---|
| 3,609,471 A | 9/1971 | Scace et al. | |
| 4,644,385 A | * 2/1987 | Nakanishi | ........... H01L 23/4332 165/80.4 |
| 4,848,090 A | * 7/1989 | Peters | ..................... F25B 21/02 62/3.3 |
| 5,866,953 A | 2/1999 | Akram et al. | |
| 5,940,271 A | 8/1999 | Mertol | |

(Continued)

FOREIGN PATENT DOCUMENTS

| | | | | |
|---|---|---|---|---|
| JP | 2008202880 | * 8/2008 | ......... | H01L 23/473 |
| JP | 013186474 | * 9/2013 | ............. | F28D 15/02 |

(Continued)

OTHER PUBLICATIONS

U.S. Appl. No. 15/270,607, filed Sep. 20, 2016, Hunter.

*Primary Examiner* — Huan H Tran
(74) *Attorney, Agent, or Firm* — Luis M. Ortiz; Kevin Soules; Kermit D. Lopez

(57) ABSTRACT

A temperature control system, the system comprising a cooling block configured to be in conductive communication with a heat source, said cooling block comprising a stem and a base, a cooling fluid configured to circulate through the base of the cooling block, and an electrical barrier formed in the base of the cooling block between the heat source and the cooling fluid.

17 Claims, 4 Drawing Sheets

(56) References Cited

U.S. PATENT DOCUMENTS

| | | | |
|---|---|---|---|
| 6,523,353 B2 * | 2/2003 | Evans | F25B 21/02 |
| | | | 348/E5.142 |
| 6,545,352 B1 | 4/2003 | Ruckdeschel | |
| 6,814,445 B2 * | 11/2004 | Kalyandurg | G02B 26/0841 |
| | | | 348/771 |
| 6,816,375 B2 * | 11/2004 | Kalyandurg | G02F 1/133385 |
| | | | 174/16.3 |
| 7,072,184 B2 | 7/2006 | Kalyandurg | |
| 7,660,124 B2 | 2/2010 | Chen et al. | |
| 2013/0050669 A1 | 2/2013 | Maeda | |

FOREIGN PATENT DOCUMENTS

| | | | | |
|---|---|---|---|---|
| KR | 2006022598 | * | 3/2006 | G03B 21/16 |
| KR | 1020140095921 | * | 8/2014 | G03F 7/20 |

* cited by examiner

COOLING INSERT

TECHNICAL FIELD

Embodiments are generally related to the field of printing and rendering. Embodiments are also related to methods and systems for heat mitigation. Embodiments are further related to methods and systems for controlling chip temperature. Embodiments are further related to the thermal link between coolant fluid and DMD chips.

BACKGROUND

Increasingly, print systems use lasers to selectively deliver energy to a target with thermochromic ink using Digital Micro-Mirror Devices (DMDs). If the DMD chip (and its internal components) exceed a critical temperature (approximately 70 degrees C.), they can be damaged. Currently, a DMD chip can only run at 80% power for approximately 20 seconds before reaching a temperature maximum. This threshold seriously limits either the duty cycle or operating power of the print system. It would be advantageous to have the ability to operate such print systems at 100% power and at 100% duty-cycle.

Additional cooling is therefore also desirable. However, lowering the temperature of coolants is problematic because lower temperature coolants can result in condensation on the DMD chip. Condensation on the chip can cause chip failure or other problems with the printing system.

As such, there is a need in the art for systems and methods that can be used to control the temperature of a chip without necessarily reducing the temperature of associated cooling fluid.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification, claims, drawings, and abstract as a whole.

It is, therefore, one aspect of the disclosed embodiments to provide a method and system for transferring heat away from a chip.

It is another aspect of the disclosed embodiments to provide a system for improving heat exchange in a DMD based print system.

It is yet another aspect of the disclosed embodiments to provide an enhanced method and system for improving thermal control of DMD chips.

The aforementioned aspects and other objectives and advantages can now be achieved as described herein. A temperature control system comprises a cooling block configured to be in conductive communication with a heat source, the cooling block comprising a stem and a base, a cooling fluid is configured to circulate through the base of the cooling block, and an electrical barrier is formed in the base of the cooling block between the heat source and the cooling fluid.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

The particular values and configurations discussed in these non-limiting examples can be varied and are cited merely to illustrate at least one embodiment and are not intended to limit the scope thereof.

The embodiments will now be described more fully hereinafter with reference to the accompanying drawings, in which illustrative embodiments of the invention are shown. The embodiments disclosed herein can be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As used herein, the term "and/or" includes any and all combinations of one or more of the associated listed items.

The particular values and configurations discussed in the following non-limiting examples can be varied and are cited merely to illustrate one or more embodiments and are not intended to limit the scope thereof.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In one embodiment, a printing technology is disclosed. The embodiment uses thermochromic ink, which permanently changes state as energy (most commonly embodied as laser light) is deposited on the media. A marking subsystem can use a combination of high power Laser Diode Arrays (LDAs) in conjunction with a Digital Micromirror Device (DMD) or array to direct energy onto the media. The marking system can adjust the energy level incident on the media to provide a desired energy at the media surface. One problem with such a printing system arises because the DMD chip can quickly overheat from the incident laser energy.

Figure 1:
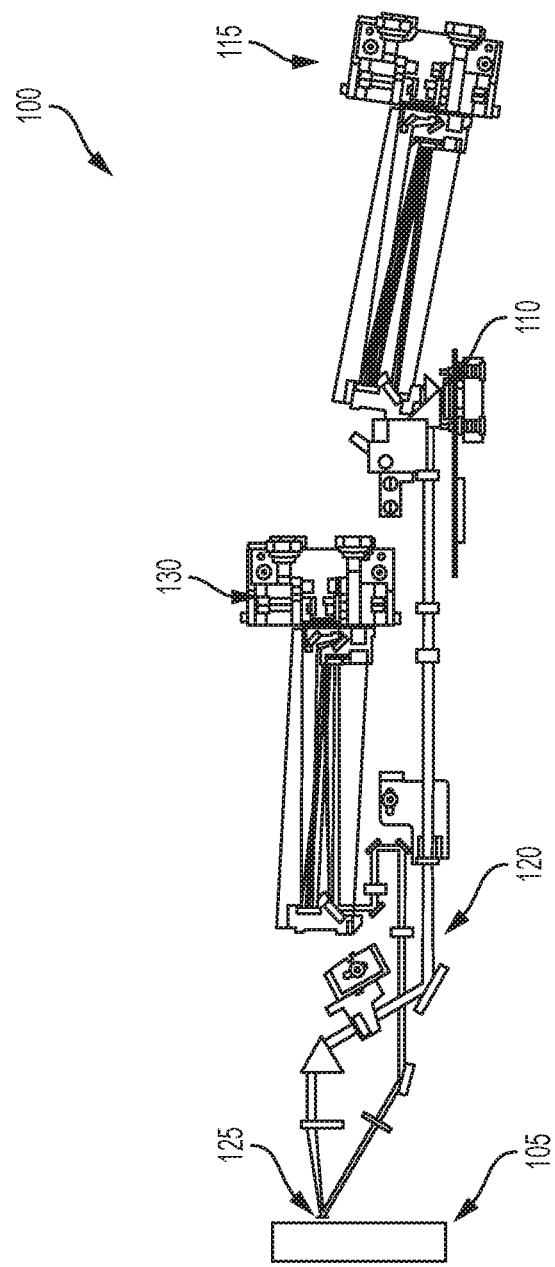
FIG. 1 depicts a block diagram of a print system which, is implemented in accordance with the disclosed embodiments.

FIG. 1 illustrates a high-level block diagram of the major components in a printing system 100 in accordance with one embodiment. The media 105 can comprise a blank medium with thermochromic ink on its exterior surface. A DMD mirror array module 110 can direct light from the imaging LDA 115 to an imaging path 120, and eventually onto the media 105 at the image plane 125.

A preheating LDA subsystem consisting of preheating LDA 130 can direct energy to the media 105 which can bring the thermochromic ink to a temperature point just below the point at which the thermochromic ink will begin to expose and reveal visible marking.

The laser light provided from the imaging LDA 115 on the DMD mirror array module 110 causes extreme temperature increases at the DMD. The embodiments disclosed herein make use of highly conductive thermal and non-conductive electrical grease and an electrically isolated coolant in a cooling block to conduct heat away from the DMD chip more efficiently.

Figure 2:
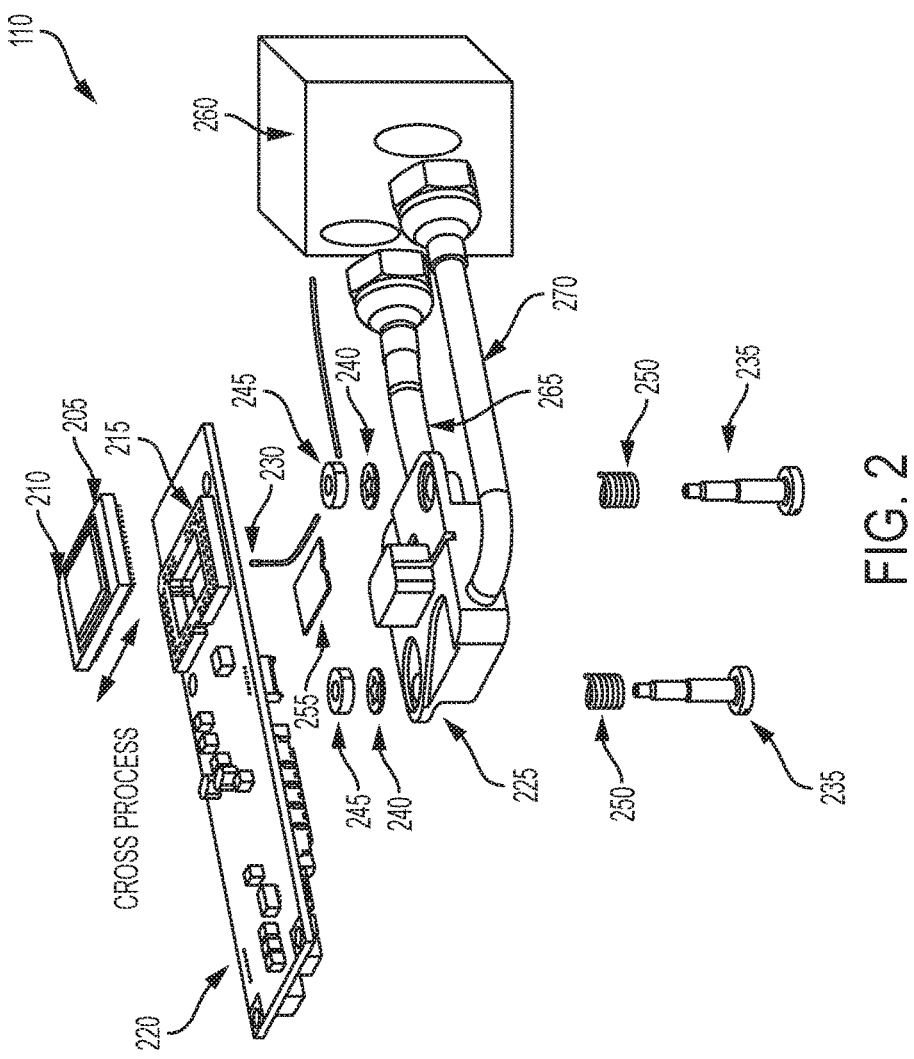
FIG. 2 depicts a block diagram of a DMD chip and cooling block arrangement implemented in accordance with the disclosed embodiments.

FIG. 2 illustrates a more detailed diagram of the DMD mirror array module 110 in accordance with the disclosed embodiments. The DMD chip 205 is disposed on a substrate 210. The chip 205 and substrate 210 can be operably connected to a socket 215 provided on a printed circuit board (PCB) 220. The PCB 220 includes circuitry and/or electronic components that are used to communicate with and control the DMD chip 205. In some cases; the PCB may further communicate with a computer system, which may be used to control the print processing.

Below the DMD chip 205 and PCB 210, a cooling block 225 can be configured to transfer heat away from the DMD chip 205. A thermistor 230 can be connected to the DMD chip 205 to measure temperature of the DMD chip 205. Thermistors are generally understood to be resistors where the resistance of the resistor depends on the temperature of the resistor. Thus, the resistance of the thermistor can be correlated to the temperature at the thermistor. It should be appreciated that thermistor 230 may alternatively be embodied as other temperature measuring apparatuses, such as a thermometer.

Shoulder screws 235 can run through the cooling block 225 and engage complaint washers 240 and push nuts 245. The shoulder screws 235 are used to hold the cooling block 225 in place against the DMD chip 205/PCB 210. Additional insulated springs 250 can be used to ensure quality contact between the cooling block 225 and DMD chip 205.

Thermally conductive grease 255 can be applied to the cooling block 225 at the interface between the cooling block 225 and the DMD chip 205. The thermally conductive grease 255 is intended to be applied sparingly. Preferably, the thermally conductive grease 255 is applied at the minimum possible thickness that still maximizes thermal contact between the cooling block 225 and DMD chip 205. In certain embodiments, the thermally conductive grease 255 may be embodied as epoxy, silicone, urethane, acrylates, aluminum oxide, boron nitride, zinc oxide, and aluminum nitride. Other thermally conductive greases may alternatively be used.

The cooling block 225 is fitted inline with a coolant circulation system 260. The coolant circulation system 260 circulates coolant via inlet 265 into cooling block 225. Heat is transferred to the coolant while it is in the cooling block 225 and then circulated out of the cooling block 225 via outlet 270. Any number of pumps, ducts, manifolds, compressors, refrigerants, or other such equipment may be used in association with the coolant circulation system 260. In certain embodiments, the coolant circulation system 260 may comprise a pump refrigerator, heat pump, chiller, or other such system. In certain embodiments, the coolant may comprise antifreeze (e.g., ethylene glycol, diethylene glycol, or propylene glycol), Oils (Mineral oils, cutting oils, silicone oils), Refrigerants (R-12, R-22, R-134a), or the like.

Figure 3:
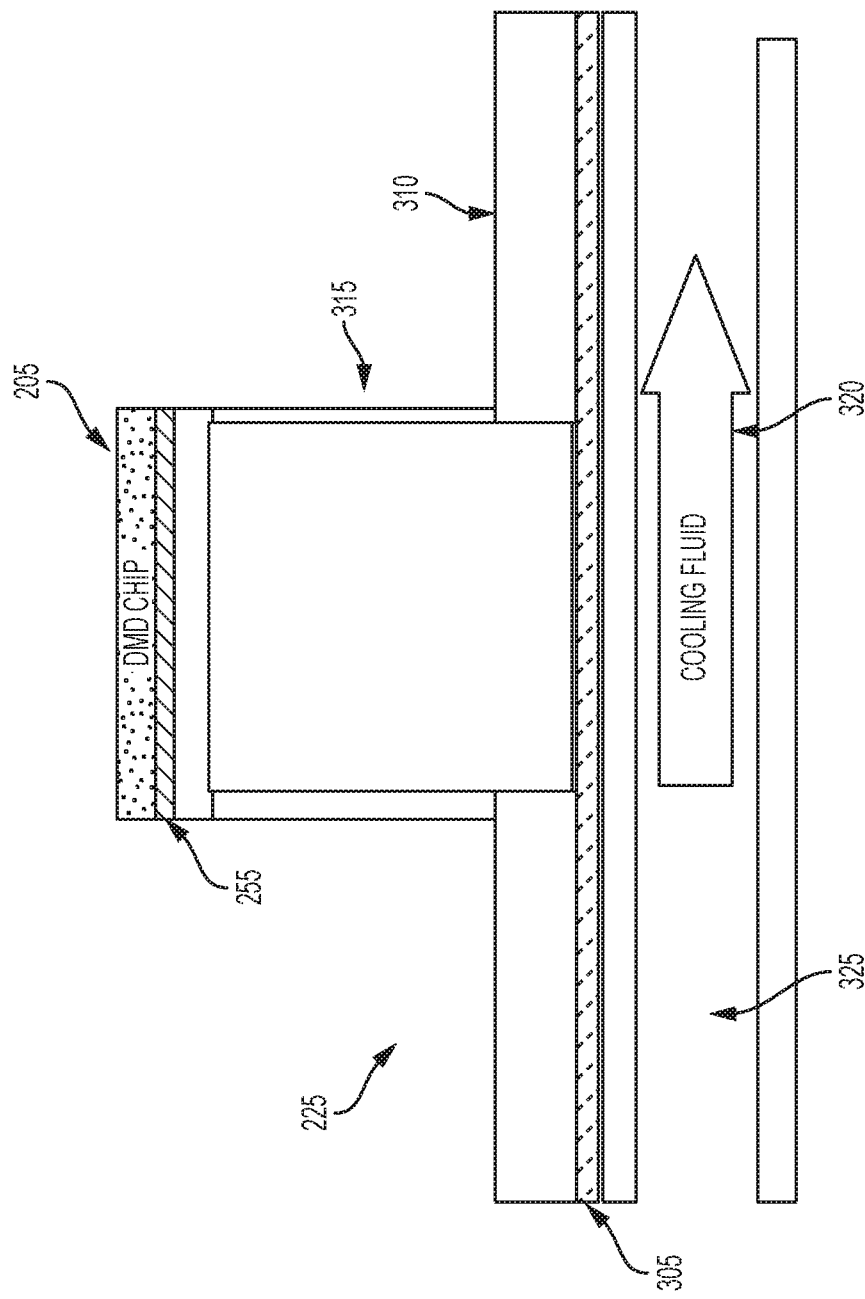
FIG. 3 depicts a cooling block in accordance with the disclosed embodiments.

FIG. 3 illustrates a view of the cooling block 225 in accordance with the disclosed embodiments. The cooling block 225 can comprise a thermal pillar 315 and a base 310. The thermal pillar 315 forms the stub of the cooling block 225 that is in thermal contact with the DMD chip 205. As noted, thermal grease 255 may be applied to the interface between the thermal pillar 315 and DMD chip 205.

The base 310 includes manifold 325, which allows coolant 320 to circulate through the cooling block 225. As incident energy increases the temperature at the DMD chip, the heat is transferred through thermal grease 255 to the thermal pillar 315 and eventually into the coolant 320 circulating through manifold 325.

Of particular importance is the inclusion of electrical barrier 305 in the base 310 of cooling block 225 between the coolant 320 and DMD chip 205. The electrical barrier 305 electrically isolates the DMD chip 205 from the coolant 320. The electrical barrier may be embodied as a layer of one or more electrically insulative, but thermally conductive materials in the cooling base 310. In certain embodiments, the electrical barrier 305 may comprise a silicon layer or sheet, polymers, rubbers, ceramics, plastics, or other similar materials.

The electrical barrier 305 provides electrical isolation of the DMD chip 205 from the cooling fluid 320. This is necessary to prevent a grounding path from the DMD chip 205 through the cooling block 225 and in particular to the coolant 320. The location of the electrical barrier 305 in the base 310 of cooling block 225 has the additional benefit that the large surface area of the electrical barrier layer 305 formed in the base 310 (as opposed to the thermal pillar 315) provides a significant improvement in the cooling capacity of the cooling block 225.

Figure 4:
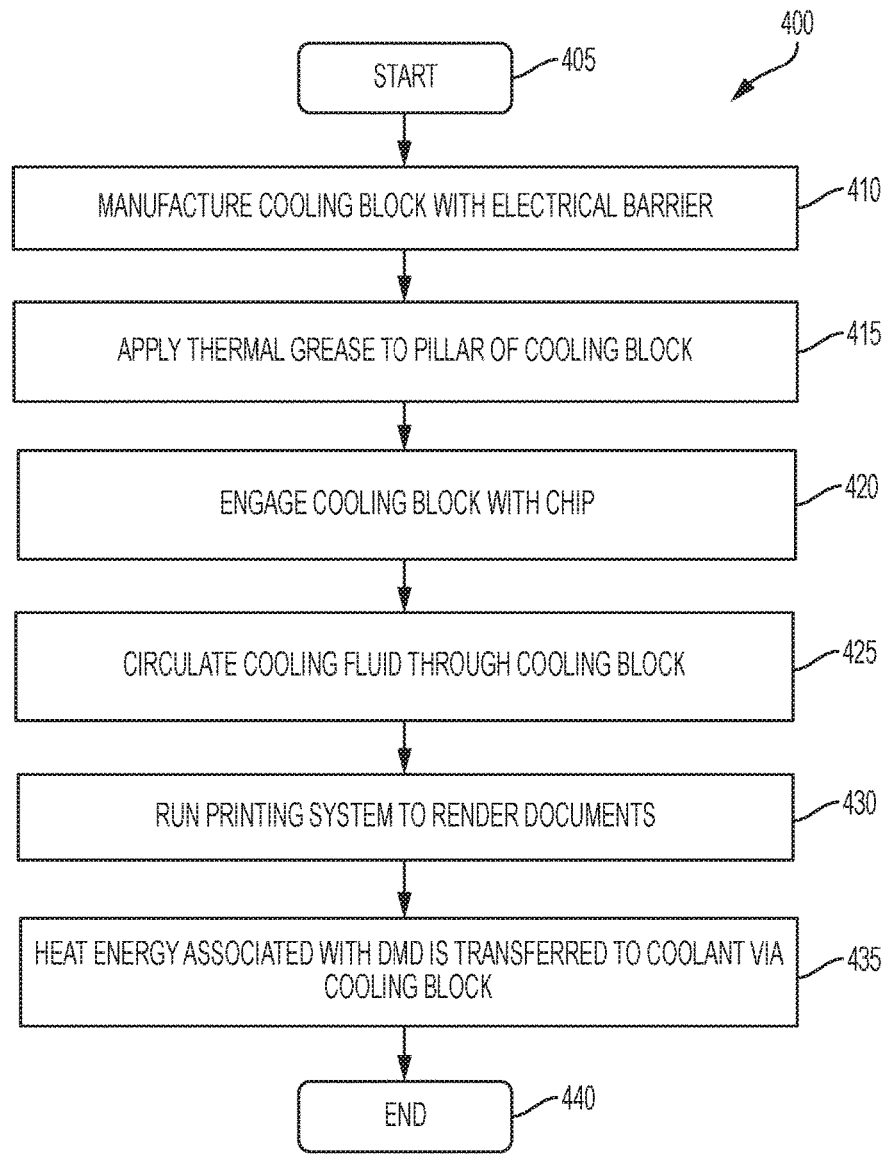
FIG. 4 depicts a flow chart illustrating steps associated with a method for cooling a chip used in rending media in accordance with the disclosed embodiments.

FIG. 4 illustrates steps associated with a method 400 for cooling a chip. The method begins at block 405. At block 410, a cooling block can be manufactured. This includes forming an electric barrier in the base of the cooling block that electrically separates the coolant that flows through the cooling block and the chip. At block 415, a thermal grease can be applied to the thermal pillar of the cooling block.

The cooling block is thus ready for deployment. At block 420, the cooling block can be engaged with the chip and attached to a coolant circulation system. The thermal grease serves as the interface between the cooling block and the chip. The coolant circulation system can then be used to circulate coolant through the cooling block as shown at block 425.

The printing system associated with the DMD chip may now be engaged to render printed media as illustrated at block 430. The heat energy associated with the incident light from the LDA is transferred from the heat sink to the coolant. The electrical barrier prevents the formation of a path to ground from, the chip to the coolant. This allows the uninterrupted use of the printing system without overheating. The method ends at block 440.

Based on the foregoing, it can be appreciated that a number of embodiments, preferred and alternative, are disclosed herein. For example, in one embodiment, a temperature control system comprises a cooling block configured to be in conductive communication with a heat source, the cooling block comprising a stem and a base, a cooling fluid configured to circulate through the base of the cooling block, and an electrical barrier formed in the base of the cooling block between the heat source and the cooling fluid.

In an embodiment, the temperature control system further comprises a thermally conductive grease applied to an interface between the stem and the heat source. The thermally conductive grease comprises at least one of epoxy, silicone, urethane, acrylates, aluminum oxide, boron nitride, zinc oxide, and aluminum nitride.

In another embodiment, an electrical barrier comprises at least one of silicon, polymer, rubber, ceramic, and plastic.

In an embodiment, the temperature control system further comprises a cooling fluid circulation module comprising a cooling pump and cooling manifold configured to circulate the cooling fluid through the base of the cooling block.

In an embodiment, the heat source comprises a chip. In an embodiment, the chip comprises a digital micromirror device associated with a thermochromic print system.

In another embodiment, a temperature control apparatus comprises a cooling block configured to be in conductive communication with a heat source, the cooling block comprising a stem and a base, a cooling fluid configured to circulate through the base of the cooling block, and an electrical barrier formed in the base of the cooling block between the heat source and the cooling fluid.

In an embodiment, the temperature control apparatus of claim 8 further comprises a thermally conductive grease applied to an interface between the stem and the heat source. The thermally conductive grease comprises at least one of epoxy, silicone, urethane, acrylates, aluminum oxide, boron nitride, zinc oxide, and aluminum nitride.

In an embodiment, the electrical barrier comprises at least one of silicon, polymer, rubber, ceramic, and plastic.

In an embodiment, the temperature control apparatus further comprises a cooling fluid circulation module comprising a cooling pump and cooling manifold configured to circulate the cooling fluid through the base of the cooling block.

In another embodiment, the heat source comprises a chip. In an embodiment, the chip comprises a digital micromirror device associated with a thermochromic print system.

In yet another embodiment, a temperature control method comprises conductively communicating heat from a heat source to a cooling block, the cooling block comprising a stem and a base, circulating a cooling fluid through the base of the cooling block, and blocking electrical communication between the heat source and the cooling fluid with an electrical barrier formed in the base of the cooling block between the heat source and the cooling fluid.

In an embodiment, the temperature control method further comprises applying a thermally conductive grease to an interface between the stem and the heat source. In an embodiment, the thermally conductive grease comprises at least one of epoxy, silicone, urethane, acrylates, aluminum oxide, boron nitride, zinc oxide, and aluminum nitride.

In an embodiment, the electrical barrier comprises at least one of silicon, polymer, rubber, ceramic, and plastic.

In an embodiment of the method, the heat source comprises a chip. The chip comprises a digital micromirror device associated with a thermochromic print system.

It will be appreciated that variations of the above-disclosed and other features and functions, or alternatives thereof, may be desirably combined into many other different systems or applications. Also, that various presently unforeseen or unanticipated alternatives, modifications, variations or improvements therein may be subsequently made by those skilled in the art which are also intended to be encompassed by the following claims.

What is claimed is:

1. A temperature control system comprising:
   a cooling block configured to be in conductive communication with a heat source, said cooling block comprising a stem and a base, said base further comprising a cooling manifold configured to circulate cooling fluid through said base;
   a cooling fluid configured to circulate through said cooling manifold; and
   an electrical barrier formed in said base of said cooling block between said heat source and said cooling fluid.

2. The temperature control system of claim 1 further comprising:
   a thermally conductive grease applied to an interface between said stem and said heat source.

3. The temperature control system of claim 2 wherein said thermally conductive grease comprises at least one of:
   epoxy;
   silicone;
   urethane;
   acrylates;
   aluminum oxide;
   boron nitride;
   zinc oxide; and
   aluminum nitride.

4. The temperature control system of claim of claim 1 wherein said electrical barrier comprises at least one of:
   silicon;
   polymer;
   rubber;
   ceramic; and
   plastic.

5. The temperature control system of claim 1 further comprising:
   a cooling pump configured to circulate said cooling fluid through said manifold of said base of said cooling block.

6. The temperature control system of claim 1 wherein said heat source comprises a chip.

7. The temperature control system of claim 6 wherein said chip comprises a digital micromirror device associated with a thermochromic print system.

8. A temperature control apparatus comprising:
   a cooling block including a cooling manifold configured to be in thermally conductive communication with a digital micromirror device associated with a thermochromic print system, said cooling block further comprising a stem and a base;
   a cooling fluid configured to circulate through said base of said cooling block;
   a cooling pump configured to circulate said cooling fluid through said manifold to cool said cooling block; and
   an electrical barrier formed in said base of said cooling block between said digital micromirror device and said cooling fluid.

9. The temperature control apparatus of claim 8 further comprising:
   a thermally conductive grease applied to an interface between said stem and said digital micromirror device.

10. The temperature control apparatus of claim 9 wherein said thermally conductive grease comprises at least one of:
    epoxy;
    silicone;
    urethane;

acrylates;
aluminum oxide;
boron nitride;
zinc oxide; and
aluminum nitride.

11. The temperature control apparatus of claim 8 wherein said electrical barrier comprises at least one of:
silicon;
polymer;
rubber;
ceramic; and
plastic.

12. A temperature control method comprising:
conductively communicating heat from a heat source to a cooling block, said cooling block comprising a stem and a base and said base further comprising a cooling manifold;
circulating a cooling fluid through said base of said cooling block through said cooling manifold; and
blocking electrical communication between said heat source and said cooling fluid with an electrical barrier formed in said base of said cooling block between said heat source and said cooling fluid.

13. The temperature control method of claim 12 further comprising:
applying a thermally conductive grease to an interface between said stem and said heat source.

14. The temperature control method of claim 13 wherein said thermally conductive grease comprises at least one of:
epoxy;
silicone;
urethane;
acrylates;
aluminum oxide;
boron nitride;
zinc oxide; and
aluminum nitride.

15. The temperature control method of claim of claim 12 wherein said electrical barrier comprises at least one of:
silicon;
polymer;
rubber;
ceramic; and
plastic.

16. The temperature control method of claim 12 wherein said heat source comprises a chip.

17. The temperature control method of claim 16 wherein said chip comprises a digital micromirror device associated with a thermochromic print system.

* * * * *